United States Patent
Gomes et al.

(10) Patent No.: US 12,310,032 B2
(45) Date of Patent: May 20, 2025

(54) STACKED BACKEND MEMORY WITH RESISTIVE SWITCHING DEVICES

(71) Applicant: Intel Corporation, Santa Clara, CA (US)

(72) Inventors: Wilfred Gomes, Portland, OR (US); Abhishek A. Sharma, Hillsboro, OR (US); Van H. Le, Beaverton, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 834 days.

(21) Appl. No.: 17/342,144

(22) Filed: Jun. 8, 2021

(65) Prior Publication Data

US 2022/0392957 A1    Dec. 8, 2022

(51) Int. Cl.
*H10B 63/00* (2023.01)
*H10B 61/00* (2023.01)

(52) U.S. Cl.
CPC .............. *H10B 63/30* (2023.02); *H10B 61/22* (2023.02)

(58) Field of Classification Search
CPC ...... H10B 63/30; H10B 61/22; H10N 70/826; G11C 2213/79
See application file for complete search history.

(56) References Cited

U.S. PATENT DOCUMENTS

| | | | |
|---|---|---|---|
| 2007/0256858 A1* | 11/2007 | Kariya | H01L 23/49827 257/E23.062 |
| 2009/0070721 A1 | 3/2009 | Solomon | |
| 2012/0250443 A1 | 10/2012 | Saraswat et al. | |
| 2013/0112459 A1* | 5/2013 | Aoshima | B32B 27/20 428/435 |

(Continued)

FOREIGN PATENT DOCUMENTS

| | | |
|---|---|---|
| CN | 111357108 A | 6/2020 |
| WO | 0075793 A1 | 12/2000 |

(Continued)

OTHER PUBLICATIONS

Extended European Search Report in EP Application No. 22177539.8 dated Nov. 7, 2022, 7 pages.

(Continued)

*Primary Examiner* — Shih Tsun A Chou
(74) *Attorney, Agent, or Firm* — Akona IP PC

(57) ABSTRACT

IC devices with stacked backend memory with resistive switching devices are disclosed. An example IC device includes a support structure, a frontend layer with a plurality of frontend devices, and a backend layer with a plurality of resistive switching devices, the resistive switching devices being, e.g., part of memory cells of stacked backend memory. For example, the backend layer may implement stacked arrays of 1T-1RSD memory cells, with resistive switching devices coupled to some S/D regions of access transistors of the memory cells. Such memory cells may be (Continued)

used to implement stacked eMRAM or eRRAM, with access transistors being TFTs. Stacked TFT-based eMRAM or eRRAM as described herein may help increase density of MRAM or RRAM cells, hide the peripheral circuits that control the memory operation below the memory arrays, and address the scaling challenge of some conventional memory technologies.

20 Claims, 10 Drawing Sheets

(56) References Cited

U.S. PATENT DOCUMENTS

| | | | | |
|---|---|---|---|---|
| 2014/0353662 | A1* | 12/2014 | Shukh | H10B 63/30 257/43 |
| 2015/0249211 | A1 | 9/2015 | Knobloch et al. | |
| 2016/0190208 | A1 | 6/2016 | Nazarian et al. | |
| 2019/0221557 | A1 | 7/2019 | Kim et al. | |
| 2019/0273119 | A1* | 9/2019 | Zhou | H10B 63/30 |
| 2020/0098824 | A1 | 3/2020 | Sharma et al. | |
| 2020/0135719 | A1 | 4/2020 | Brewer | |
| 2020/0411078 | A1 | 12/2020 | Sharma et al. | |
| 2020/0411428 | A1 | 12/2020 | Lilak et al. | |
| 2021/0074825 | A1 | 3/2021 | Sharma et al. | |
| 2021/0125990 | A1 | 4/2021 | Gomes et al. | |
| 2021/0134802 | A1 | 5/2021 | Gomes et al. | |
| 2021/0375873 | A1 | 12/2021 | Majhi et al. | |

FOREIGN PATENT DOCUMENTS

| | | |
|---|---|---|
| WO | 2013095561 A1 | 6/2013 |
| WO | 2018236356 A1 | 12/2018 |

OTHER PUBLICATIONS

Tallis, Billy, "Micron 3D NAND Status Update," AnandTech, retrieved from the internet on Jun. 10, 2019, https://www.anandtech.com/show/10028/micron-3d-nand-status-update, 6 pages.

* cited by examiner

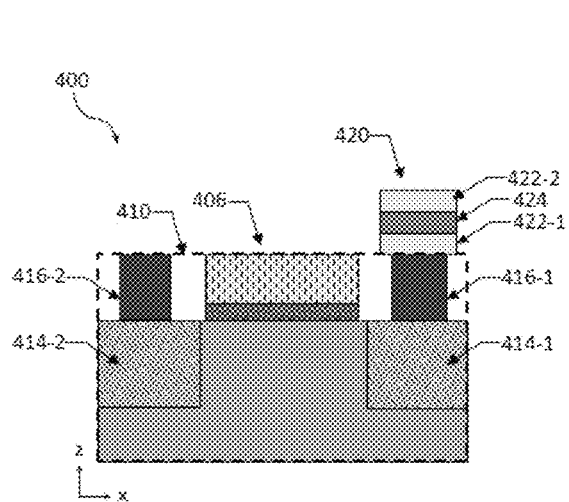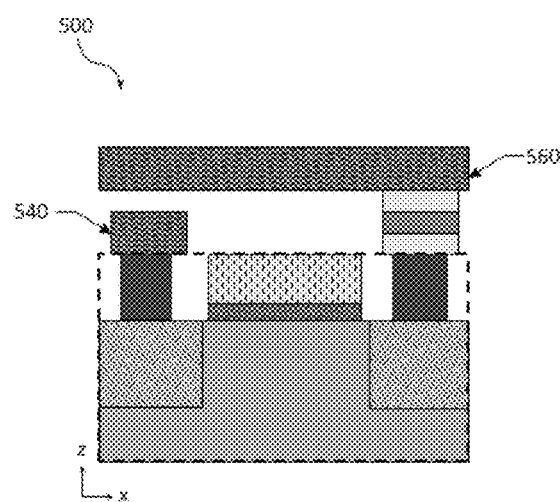
FIG. 4　　　　　　　　FIG. 5

STACKED BACKEND MEMORY WITH RESISTIVE SWITCHING DEVICES

BACKGROUND

Embedded memory is important to the performance of modern system-on-a-chip (SoC) technology. Low power and high density embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 4 and 5 provide schematic illustrations of a cross-sectional side view of example memory cells with resistive switching devices, according to some embodiments of the present disclosure.

DETAILED DESCRIPTION

Figure 1:
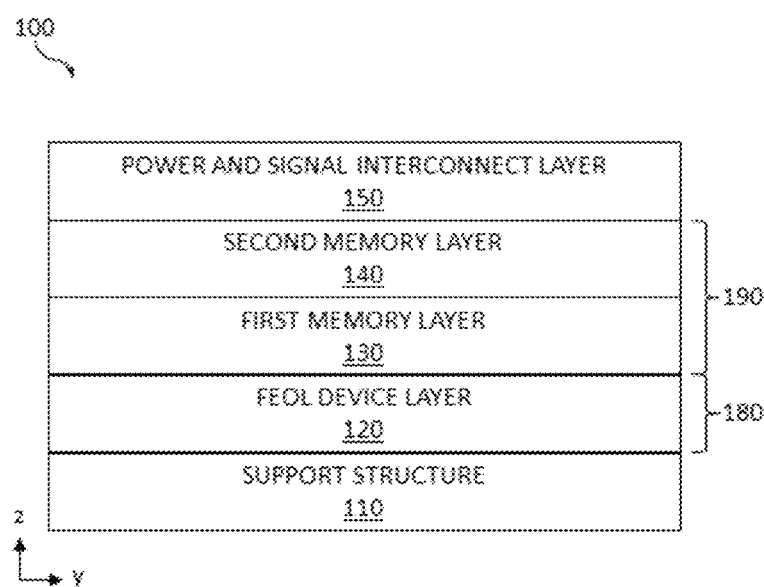
FIG. 1 provides a block diagram of an integrated circuit (IC) device with stacked backend memory with resistive switching devices, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating stacked backend memory with resistive switching devices as described herein, it might be useful to first understand phenomena that may come into play in certain IC arrangements. The following foundational information may be viewed as a basis from which the present disclosure may be properly explained. Such information is offered for purposes of explanation only and, accordingly, should not be construed in any way to limit the broad scope of the present disclosure and its potential applications.

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to magnetic random-access memory (MRAM) and in particular, embedded MRAM (eMRAM), or resistive random-access memory (RRAM) and in particular, embedded RRAM (eRRAM), because these types of memory may be considered as nonvolatile, semi-nonvolatile, or at least less volatile than some other types of memory such as dynamic random-access memory (DRAM).

An MRAM memory cell, e.g., an eMRAM cell, may include a magnetic tunnel junction (MTJ) for storing a bit value, or a memory state (e.g., logical "1" or "0") of the cell, and a selector device such as an access transistor controlling access to the cell (e.g., access to write information to the cell or access to read information from the cell). Such a memory cell may be referred to as a "1T-1MTJ memory cell," highlighting the fact that it uses one transistor (i.e., "1T" in the term "1T-1MTJ memory cell") and one MTJ (i.e., "1MTJ" in the term "1T-1MTJ memory cell"). Similarly, an RRAM memory cell, e.g., an eRRAM cell, may include a filamentary oxide device (FOD) for storing a bit value, or a memory state (e.g., logical "1" or "0") of the cell, and a selector device such as an access transistor controlling access to the cell (e.g., access to write information to the cell or access to read information from the cell). Such a memory cell may be referred to as a "1T-1FOD memory cell," highlighting the fact that it uses one transistor (i.e., "1T" in the term "1T-1FOD memory cell") and one FOD (i.e., "1FOD" in the term "1T-1FOD memory cell"). A "resistive switching device" (also referred to as a "resistive storage element" or a "resistive switch") is a common term that may be used to describe both an MTJ and an FOD, meaning that, for both an MTJ and an FOD, resistance may be changed under the action of a sufficiently strong electric field or current. In general, a resistive switching device is a resistive storage element that, during operation, switches between two different substantially nonvolatile states: a high resistance state (HRS) and a low resistance state (LRS). When used in a memory cell, the state of a resistive switching device (or, phrased differently, the change in resistance of a resistive switching device) may be used to represent different memory states or different bit values of the memory cell (e.g., a first resistance value of a resistive switching device may represent a logical "1" of a memory cell, while a second resistance value, different from the first resistance value, may represent a logical "0"—e.g., a HRS may represent "1" and "LRS" may represent "0," or vice versa). A resistive switching device may have a voltage threshold beyond which the resistive switching device is in the LRS; driving a resistive switching device into the LRS may be referred to as SET (with an associated SET threshold voltage). Similarly, a resistive switching device may have a voltage threshold beyond which the resistive switching device is in the HRS; driving a resistive switching device into the HRS may be referred to as RESET (with an associated RESET threshold voltage).

Together, 1T-1MTJ memory cells and 1T-1FOD memory cells may be referred to as "1T-1RSD memory cells," highlighting the fact that it uses one transistor (i.e., "1T" in the term "1T-1RSD memory cell") and one resistive switching device (i.e., "1RSD" in the term "1T-1RSD memory cell"). The resistive switching device of a 1T-1RSD memory cell may be coupled to one source/drain (S/D) region/terminal of the access transistor (e.g., to the source region of the access transistor), while the other S/D region of the access transistor may be coupled to a bit-line (BL), a gate terminal of the transistor may be coupled to a wordline (WL), and the other terminal of the resistive switching device (i.e., the one not coupled to the S/D region of the access transistor) may be coupled to a select-line (SL). Since such a memory cell can be fabricated with as little as a single access transistor, it can provide higher density and lower standby power versus some other types of memory in the same process technology, e.g., static random-access memory (SRAM).

Various memory cells have, conventionally, been implemented with access transistors being front end of line (FEOL), logic-process based, transistors implemented in an upper-most layer of a semiconductor substrate (i.e., frontend transistors). Inventors of the present disclosure realized that using conventional FEOL transistors as access transistors of memory cells (e.g., as access transistors of 1T-1RSD memory cells) creates several challenges.

One challenge relates to the leakage of an access transistor, i.e., current flowing between the source and the drain of a transistor when the transistor is in an "off" state. Since reducing leakage of logic transistors in the scaled technology is difficult, implementing 1T-1RSD memory in advanced technology nodes (e.g., 10 nanometer (nm), 7 nm, 5 nm, and beyond) can be challenging.

Another challenge associated with the use of logic transistors in 1T-1RSD memory cells relates to the location of the capacitors such memory cells. Namely, it may be desirable to provide capacitors in metal layers close to their corresponding access transistors. Since logic transistors are implemented as FEOL transistors provided directly on the semiconductor substrate, the corresponding resistive switching devices of 1T-1RSD memory cells then have to be embedded in lower metal layers in order to be close enough to the logic access transistors. As the pitches of lower metal layers aggressively scale in advanced technology nodes, embedding the resistive switching devices in the lower metal layers poses significant challenges to the scaling of memory utilizing resistive switching devices.

Yet another challenge resides in that, given a usable surface area of a substrate, there are only so many FEOL transistors that can be formed in that area, placing a significant limitation on the density of memory cells of a memory array.

Embodiments of the present disclosure may improve on at least some of the challenges and issues described above. In contrast to the conventional memory approaches with FEOL transistors as described above, various embodiments of the present disclosure provide memory cells, arrays, and associated methods and devices, which use thin-film transistors (TFTs) as access transistors of at least some of the memory cells. A TFT is a special kind of a field-effect transistor (FET) made by depositing a thin film of an active semiconductor material, as well as a dielectric layer and metallic contacts, over a supporting layer that may be a non-conducting layer. At least a portion of the active semiconductor material forms a channel of the TFT. This is different from conventional, non-TFT, frontend transistors where the active semiconductor channel material is typically a part of a semiconductor substrate, e.g., a part of a silicon wafer. Using TFTs as access transistors of memory cells provides several advantages and enables unique architectures that were not possible with conventional, frontend transistors.

One advantage is that a TFT may have substantially lower leakage than a frontend transistor, allowing to relax the demands on the resistive switching device of a 1T-1RSD memory cell. For example, using a lower leakage TFT in a 1T-1RSD memory cell may allow the memory cell to use a resistive switching device with lower level of resistive switching (e.g., a smaller difference between the resistance values representing different memory states) while still meeting the same data retention requirements of other approaches.

In addition, access TFTs may be moved to the back end of line (BEOL) layers (also referred to as "backend") of an advanced complementary metal-oxide-semiconductor (CMOS) process, which means that their corresponding resistive switching devices can be implemented in the upper metal layers with correspondingly thicker interlayer dielectric (ILD) and larger metal pitch. This eases the integration challenge introduced by embedding the resistive switching devices. Furthermore, when at least some access transistors are implemented in the backend layers as TFTs, at least portions of different memory cells may be provided in different layers above a substrate, thus enabling a stacked architecture of memory arrays. In this context, the term "above" refers to being further away from the substrate or the FEOL of an IC assembly or device (e.g., the IC assembly 100 shown in FIG. 1), while the term "below" refers to being closer towards the substrate or the FEOL of the IC assembly or device.

In one aspect of the present disclosure, IC devices with stacked backend memory with resistive switching devices are disclosed. As used herein, the term "stacked backend memory with resistive switching devices" refers to any memory cells that are implemented in the BEOL and use one or more resistive switching devices, such as MRAM memory cells or RRAM memory cells with TFTs, as described herein. An example IC device includes a support structure, a FEOL/frontend layer with a plurality of FEOL/frontend devices, and a BEOL/backend layer with a plurality of resistive switching devices, the resistive switching devices being, e.g., part of memory cells of the stacked backend memory as described herein. For example, the BEOL/backend layer may implement stacked arrays of 1T-1RSD memory cells as described herein, with resistive switching devices coupled to some S/D regions of access transistors of the memory cells. In some embodiments, the FEOL/frontend layer may be between the support structure and the BEOL/backend layer (e.g., if the support structure is a substrate on which the FEOL/frontend devices were fabricated). In other embodiments, the BEOL/backend layer may be between the FEOL/frontend layer and the support structure (e.g., if the BEOL/backend layer, possibly with some additional layers in between is attached to the support structure in a flip-chip configuration after the FEOL/frontend and the BEOL/backend layers have been formed. In various embodiments, memory cells of stacked backend memory with resistive switching devices may be used to implement stacked eMRAM or eRRAM, with access transistors being TFTs. Stacked TFT-based eMRAM or eRRAM as described herein allows significantly increasing density of MRAM or RRAM cells in a memory array having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of the memory array with a given memory cell density. Furthermore, by embedding at least some, but preferably all, of the TFT-based access transistors and the corresponding resistive switching devices in the upper metal layers (i.e., in the BEOL layers), the peripheral circuits that control the memory operation can be hidden below the memory area to substantially reduce the memory macro array (i.e., the footprint area in the x-y plane of an example coordinate system shown in the present drawings). Peripheral circuits of conventional MRAM or RRAM designs account for a significant portion of the total memory macro area, so moving the peripheral circuits below the MRAM or RRAM memory array can substantially reduce the memory footprint area. Stacked TFT-based eMRAM or eRRAM described herein may be used, for example, to address the scaling challenge of some conventional (e.g., FEOL-based) memory technologies and enable high density embedded memory in an advanced CMOS process. Other technical effects will be evident from various embodiments described here.

In the following, some descriptions may refer to a particular S/D region or contact being either a source region/contact or a drain region/contact. However, unless specified otherwise, which region/contact of a transistor is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed.

While some descriptions provided herein may refer to transistors being top-gated transistors, embodiments of the present disclosure are not limited to only this design and include transistors of various other architectures, or a mixture of different architectures. For example, in various embodiments, various TFTs described herein may include bottom-gated transistors, top-gated transistors, FinFETs, nanowire transistors, planar transistors, etc., all of which being within the scope of the present disclosure. Furthermore, although descriptions of the present disclosure may refer to logic devices or memory cells provided in a given layer, each layer of the IC devices described herein may also include other types of devices besides logic or memory devices described herein. For example, any of the memory layers described herein may also include logic circuits, and vice versa.

Furthermore, in the following detailed description, various aspects of the illustrative implementations will be described using terms commonly employed by those skilled in the art to convey the substance of their work to others skilled in the art.

For example, a term "interconnect" may be used to describe any element formed of an electrically conductive material for providing electrical connectivity to one or more components associated with an IC or/and between various such components. In general, the "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of an IC chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC chip or a support structure over which an IC structure is provided and may interconnect two conductive lines in adjacent levels or two conductive lines in not adjacent levels. A term "metallization stack" may be used to refer to a stack of one or more interconnects for providing connectivity to different circuit components of an IC chip.

In another example, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials. If used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 7A-7B, such a collection may be referred to herein without the letters, e.g., as "FIG. 7."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various devices and assemblies illustrated in the present drawings do not represent an exhaustive set of IC devices that may include stacked backend memory with resistive switching devices as described herein, but merely provide examples of such devices. In particular, the number and positions of various elements shown in the present drawings is purely illustrative and, in various other embodiments, other numbers of these elements, provided in other locations relative to one another may be used in accordance with the general architecture considerations described herein. Further, the present drawings are intended to show relative arrangements of the elements therein, and the devices and assemblies of these figures may include other elements that are not specifically illustrated (e.g., various interfacial layers). Similarly, although particular arrangements of materials are discussed with reference to the present drawings, intermediate materials may be included in the IC devices and assemblies of these figures. Still further, although some elements of the various cross-sectional views are illustrated in the present drawings as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of the IC devices that include stacked backend memory with resistive switching devices as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices that include stacked backend memory with resistive switching devices as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

FIG. 1 provides a block diagram of an example IC device 100 with stacked backend memory with resistive switching devices, according to some embodiments of the present disclosure. As shown in FIG. 1, in general, the IC device 100 may include a support structure 110, an FEOL device layer 120, at least a first memory layer 130, optionally a second memory and further memory layers 140, and a power and signal interconnect layer 150. Together, one or more memory layers (e.g., the first memory layer 130 and other memory layers such as the second memory layer 140) form a BEOL layer 190.

In general, implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. In some embodiments, the substrate may be non-crystalline. In some embodiments, the substrate may be a printed circuit board (PCB) substrate. Although a few examples of materials from which the substrate may be formed are described here, any material that may serve as a foundation upon which the FEOL devices of the FEOL device layer 120 may be built falls within the spirit and scope of the present disclosure.

In some embodiments, the support structure 110 may include a semiconductor substrate as described above. In other embodiments, the support structure 110 may be a support structure of a non-semiconductor material. For example, such a support structure may be provided after the FEOL devices of the FEOL device layer 120 (and, possibly, after the stacked backend memory with resistive switching devices has been implemented in the BEOL 190) have been formed over a semiconductor substrate, after which the semiconductor substrate may be removed (e.g., by flipping the IC device and polishing or grinding the semiconductor substrate until electrical contacts can be made to the FEOL devices of the FEOL device layer 120) and, instead a non-semiconductor support structure may be attached (e.g., using a bonding process such as oxide bonding) to provide mechanical stability. In some embodiments, when the support structure 110 is a non-semiconductor support structure, it may be, or may include, any non-semiconductor material that has a dielectric constant lower than that of silicon (Si), e.g., lower than about 11, e.g., or lower than about 10.5. In some such embodiments, the support structure 110 may include, a glass substrate, a glass die, a glass wafer or a glass chip, and/or may include any suitable glass material, since glass has dielectric constants in a range between about 5 and 10.5. Examples of glass materials include silicon oxide materials, possibly doped with elements and compounds such as boron, carbon, aluminum, hafnium oxide, e.g., in doping concentrations of between about 0.01% and 10%. In other embodiments of the support structure 110 being a non-semiconductor support structure, it may be, or include, other solid materials having a dielectric constant lower than that of Si, such as mica. Using a support structure with a dielectric constant lower than that of Si at the back of an IC device (e.g., as shown in FIG. 1) may advantageously decrease various parasitic effects associated with the FEOL/frontend devices of the IC device 100, since such parasitic effects are typically proportional to the dielectric constant of the surrounding medium.

FIG. 1 and some of the other drawings illustrate an embodiment of the IC device 100 where the FEOL layer 120 is between the support structure 110 and the BEOL layer 190. However, although not specifically shown in FIG. 1 and other drawings, in some embodiments, the support structure 110 may be provided over the BEOL layer 190, so that the BEOL layer 190 is between the FEOL layer 120 and the support structure 110. For example, such a support structure may be provided after the FEOL devices of the FEOL device layer 120 (and, possibly, after the stacked backend memory with resistive switching devices has been implemented in the BEOL 190) have been formed over a semiconductor substrate, after which the BEOL layer 190, or any layer provided over the BEOL layer 190, may be attached to the support structure 110 (e.g., using a bonding process such as oxide bonding). In some embodiments, a support structure 110 provided at the front of the IC device 100 (i.e., so that the BEOL layer 190 is between the FEOL layer 120 and the support structure 110) may include any of the semiconductor or non-semiconductor materials described above. Using a support structure 110 provided at the front of the IC device 100 in the form of a support structure with a dielectric constant lower than that of Si (e.g., any of the glass materials, mica, etc., described above), may advantageously decrease various parasitic effects associated with the BEOL/backend devices of the IC device 100 and/or various parasitic effects associated with the power and signal interconnects that may be implemented at the front of the IC device 100 (e.g., if such a support structure is coupled to a power and signal interconnect layer 150 as shown in FIG. 1).

A thickness of the support structure 110 may be of any value for the support structure 110 to provide mechanical stability for the IC device 100 and, possibly, to support inclusion of various devices for further reducing the parasitic effects in the IC device. In some embodiments, the support structure 110 may have a thickness between about 0.2 micrometer (micron) and 1000 micron, e.g., between about 0.5 and 5 micron, or between about 1 and 3 micron. Although a few examples of materials from which the support structure 110 may be formed are described here, any material that may serve as a foundation upon which an IC device that includes stacked backend memory with resistive switching devices as described herein may be provided falls within the spirit and scope of the present disclosure.

The first and second memory layers 130, 140 may, together, be seen as forming a TFT memory array of the BEOL layer 190. As such, the memory array of the BEOL layer 190 may include TFTs (e.g., access transistors of memory cells as described herein), resistive switching devices, as well as word-lines (e.g., row selectors) and BLs (e.g., column selectors), making up memory cells. In some embodiments, the memory array of the BEOL layer 190 may include only the first memory layer 130, but not the second memory layer 140. In other embodiments, the memory array of the BEOL layer 190 may include more than two memory layers stacked in different layers above one another. On the other hand, the FEOL layer 120 may be a compute logic layer in that it may include various logic layers, circuits, and devices (e.g., logic transistors, e.g., frontend transistors) to drive and control a logic IC. For example, the logic devices of the compute logic layer 120 may form a memory peripheral circuit 180 to control (e.g., access (read/write), store, refresh) the memory cells of the memory array of the BEOL layer 190.

In some embodiments, the FEOL layer 120 may be provided in a FEOL and in one or more lowest BEOL sub-layers of the BEOL Layer 190 (i.e., in one or more BEOL sub-layers which are closest to the substrate over which the frontend devices of the FEOL layer 120 were built), while the first memory layer 130 and the second memory layer 140 may be seen as provided in respective higher BEOL sub-layers. Various sub-layers of the BEOL layer 190 may be (or may include) metal layers. Various metal layers of the BEOL layer 190 may be used to interconnect the various inputs and outputs of the logic devices in the FEOL layer 120 and/or of the memory cells in the memory layers 130, 140. Generally speaking, each of the metal layers of the BEOL layer 190 may include a via portion and a trench/interconnect portion. The trench portion of a metal layer is configured for transferring signals and power along electrically conductive (e.g., metal) lines (also sometimes referred to as "trenches") extending in the x-y plane (e.g., in the x or y directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL layer 190 may include only certain patterns of conductive metals, e.g., copper (Cu), aluminum (Al), tungsten (W), or cobalt (Co), or metal alloys, or more generally, patterns of an electrically conductive material, formed in an insulating medium such as an ILD. The insulating medium may include any suitable ILD materials such as silicon oxide, carbon-doped silicon oxide, silicon carbide, silicon nitride, aluminum oxide, and/or silicon oxynitride.

In other embodiments of the IC device 100, compute logic devices may be provided in a layer above the memory layers 130, 140, in between memory layers 130, 140, or combined with the memory layers 130, 140.

The power and signal interconnect layer 150, also shown in FIG. 1, may include one or more electrical interconnects configured to provide power and/or signals to/from various components of the IC device 100 (e.g., to the devices in the FEOL device layer 120 and/or to the memory cells of the stacked backend memory with resistive switching devices in the BEOL layer 190). Although the power and signal interconnect layer 150 is shown in FIG. 1 as being over the BEOL layer 190 (i.e., at the front of the IC device 100, so that the BEOL layer 190 is between the FEOL layer 120 and the power and signal interconnect layer 150), in other embodiments of the IC device 100, the power and signal interconnect layer 150 may be implemented at the back of the IC device 100, so that the FEOL layer 120 is between the power and signal interconnect layer 150 and the BEOL layer 190. In still further embodiments of the IC device 100, some portions of the power and signal interconnect layer 150 may be implemented at the back of the IC device 100 while other portions of the power and signal interconnect layer 150 may be implemented at the front of the IC device 100.

The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers. For example, power and signal interconnects for the various components of the IC device 100 may be present in any of the layers shown in FIG. 1, although not specifically illustrated in FIG. 1. Furthermore, although two memory layers 130, 140 are shown in FIG. 1, in various embodiments, the IC device 100 may include any other number of one or more of such memory layers, at least some of which implementing stacked backend memory with resistive switching devices as described herein.

Figure 2:
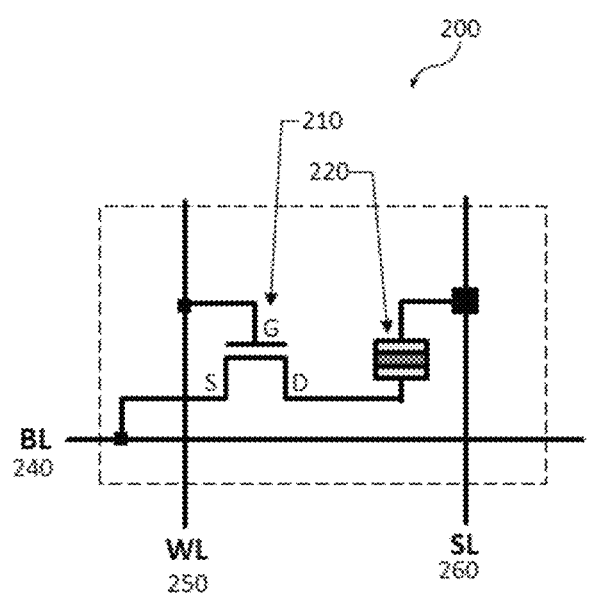
FIG. 2 provides an electric circuit diagram of a memory cell with a resistive switching device, according to some embodiments of the present disclosure.

FIG. 2 is a schematic illustration of a 1T-1RSD memory cell 200, according to some embodiments of the present disclosure. As shown, the 1T-1RSD cell 200 may include an access transistor 210 and a resistive switching device 220. The access transistor 210 has a gate terminal, a source terminal, and a drain terminal, indicated in the example of FIG. 2 as terminals G, S, and D, respectively. In the following, the terms "terminal" and "electrode" may be used interchangeably. Furthermore, for S/D terminals, the terms "terminal" and "region" may be used interchangeably.

As shown in FIG. 2, in the 1T-1RSD cell 200, the gate terminal of the access transistor 210 may be coupled to a WL 250, one of the S/D terminals of the access transistor 210 may be coupled to a BL 240, and the other one of the S/D terminals of the access transistor 210 may be coupled to a first electrode of the resistive switching device 220. As also shown in FIG. 2, the other electrode of the resistive switching device 220 may be coupled to a SL 260. As is known in the art, WL, BL, and SL may be used together to read and program the resistive switching device 220.

Each of the BL 240, the WL 250, and the SL 260, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

In some embodiments, the access transistor 210 may be a TFT. In such embodiments, the channel material of the access transistor 210 may be a thin-film material, such as a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the access transistor 210 is a TFT, the channel material of the access transistor 210 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material of the access transistor 210 may have a thickness between about 5 and 75 nanometers, including all values and ranges therein. In some embodiments, a thin-film channel material of the access transistor 210 may be deposited at relatively low temperatures, which allows depositing the channel material within the thermal budgets imposed on back end fabrication to avoid damaging other components, e.g., front end components such as the logic devices of the FEOL layer 120.

In general, the resistive switching device 220 may be a two-terminal device having a first electrode serving as a first terminal of the resistive switching device 220, a second electrode serving as a second terminal of the resistive switching device 220, and an insulator between the first and the second electrodes. In some embodiments, the resistive switching device 220 may be an MTJ. In such embodiments, the first and second electrodes of the resistive switching device 220 may include magnetic materials, such as any of iron, nickel, cobalt, aluminum, gold, etc., where one of the electrodes is thicker than the other and has a magnetic direction that is relatively constant (e.g., as defined by the stiffness of the material of that electrode), while the other electrode may be thinner and may be of a magnetic material that switches direction of its magnetization depending on the current applied to it, thus changing the resistance of the resistive switching device 220. Such a resistive switching device 220 may, thus, form an MTJ as known in the art. When the resistive switching device 220 is an MTJ, the insulator of the resistive switching device 220 may include any of an oxide of a semiconductor material (e.g., silicon oxide, or an oxide of other semiconductor materials), an oxide of a transition metal, a sulfide, an electrolyte, etc. In other embodiments, the resistive switching device 220 may be an FOD. In such embodiments, the first and second electrodes of the resistive switching device 220 may include any suitable electrically conductive materials (which may be substantially non-magnetic or magnetic materials), such as any of the electrically conductive materials described above with reference to the interconnects of the IC device 100. In one state of such a resistive switching device 220, since the insulator separates the first and second electrodes, the resistance between the first and second electrodes may be relatively large. However, in another state of such a resistive switching device 220, upon application of a current, a filament may form between the first and second electrodes, noticeably reducing the resistance, thus forming an FOD as known in the art. When the resistive switching device 220 is an FOD, the insulator of the resistive switching device 220 may include any of an oxide of a transition metal, a sulfide, an electrolyte, etc. For both the MTJ and the FOD implementations of the resistive switching device 220, a thickness of the insulator of the resistive switching device 220 may be, e.g., between about 0.5 and 100 nm, including all values and ranges therein, e.g., between about 0.5 and 20 nm, or between about 0.5 and 10 nm.

Figure 3:
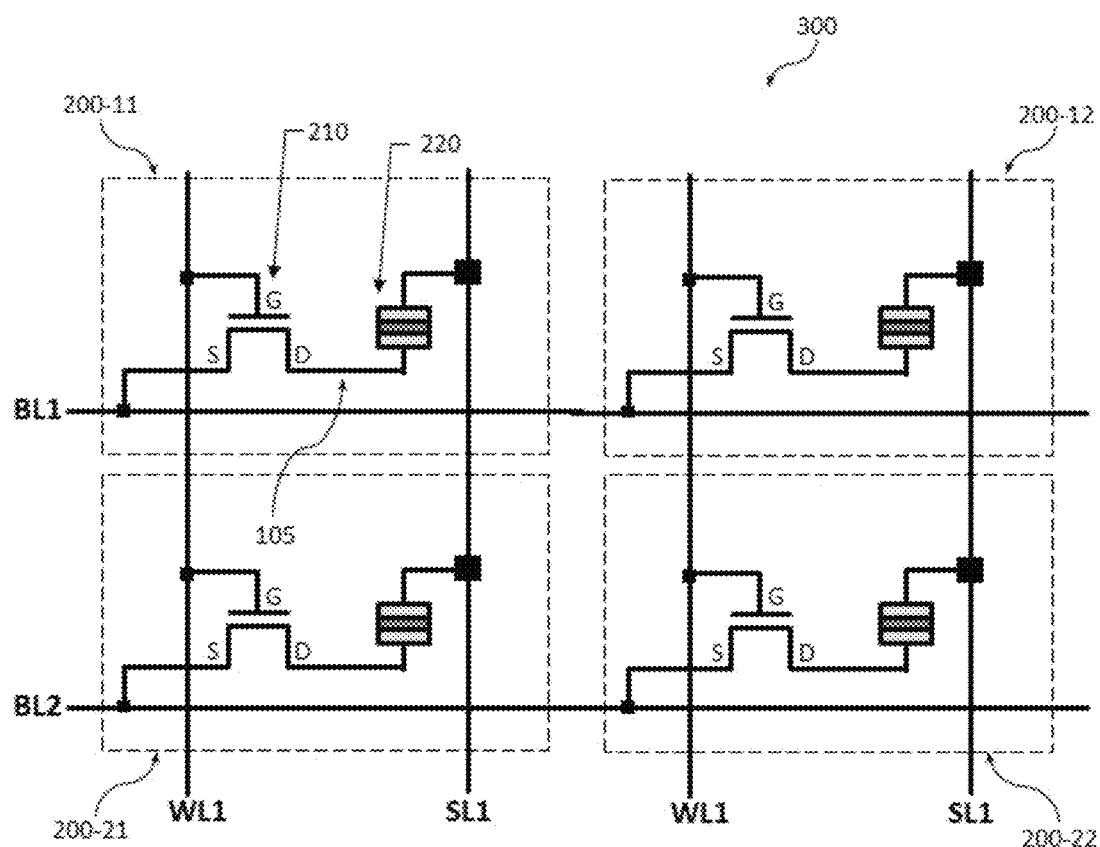
FIG. 3 provides an electric circuit diagram of an array of memory cells with resistive switching devices, according to some embodiments of the present disclosure.

FIG. 3 provides an electric circuit diagram of an array 300 of memory cells with resistive switching devices, e.g., of the memory cells 200 with resistive switching devices 220, according to some embodiments of the present disclosure. FIG. 3 provides a schematic illustration of a plurality of 1T-1RSD memory cells, namely four cells, arranged in an array 300, according to some embodiments of the present disclosure. Each memory cell shown in FIG. 3 could be any one of the 1T-1RSD memory cells as described herein, e.g., any of the memory cells 200, described herein. Each 1T-1RSD memory cell 200 as described herein is illustrated in FIG. 3 to be within a dashed box labeled 200-11, 200-12, 200-21, and 200-22. While only four such memory cells are shown in FIG. 3, in other embodiments, the array 300 may, and typically would, include many more memory cells. Furthermore, in other embodiments, the 1T-1RSD memory cells as described herein may be arranged in arrays in other manners as known in the art, all of which being within the scope of the present disclosure. The array 300 may be included in the BEOL layer 190 of the IC device 100 as described herein, e.g., in the first memory layer 130, and/or in any other memory layers that may be present in the BEOL layer 190 of the IC device 100.

FIG. 3 illustrates that, in some embodiments, a single BL can be shared among multiple memory cells 200 in a column, and that WL and SL can be shared among multiple memory cells 200 in a row. As is conventionally used in context of memory, the terms "row" and "column" do not reflect the, respectively, horizontal and vertical orientation on a page of a drawing illustrating a memory array but, instead, reflect on how individual memory cells are addressed. Namely, memory cells 200 sharing a single BL are said to be in the same column, while memory cells sharing a single WL are said to be on the same row. Thus, in FIG. 3, the horizontal lines refer to columns while vertical lines refer to rows. Different instances of each line (BL, WL, and SL) are indicated in FIG. 3 with different reference numerals, e.g. BL1 and BL2 are the two different instances of the BL as described herein. The same reference numeral on the different lines WL and SL indicates that those lines are used to address/control the memory cells in a single row. For example, WL1 and SL1 are used to address/control the memory cells 200 in row 1 (e.g., the memory cells 200-11 and 200-21, shown in the example of FIG. 3), while WL2 and SL2 are used to address/control the memory cells 200 in row 2 (e.g., the memory cells 200-12 and 200-22, shown in the example of FIG. 3), and so on. The same reference numeral on the different lines BL indicates that those lines are used to address/control the memory cells in a single column. For example, BL1 is used to address/control the memory cells 200 in column 1 (e.g., the memory cells 200-11 and 200-12, shown in the example of FIG. 3), while BL is used to address/control the memory cells 200 in column 2 (e.g., the memory cells 200-21 and 200-22, shown in the example of FIG. 3), and so on. Each memory cell 200 may then be addressed by using the BL corresponding to the column of the cell and by using the WL and SL corresponding to the row of the cell. For example, the memory cell 200-11 is controlled by BL1, WL1, and SL1, the memory cell 200-12 is controlled by BL1, WL2, and SL2, and so on.

FIGS. 4 and 5 provide schematic illustrations of a cross-sectional side view of example memory cells with resistive switching devices, according to some embodiments of the present disclosure. FIG. 4 illustrates a memory cell 400, which may be an example of the memory cell 200, described herein. FIG. 5 illustrates a memory cell 500, which may be another example of the memory cell 200, described herein.

The arrangements shown in FIGS. 4 and 5 (and other figures of the present disclosure) are intended to show relative arrangements of some of the components therein, and the arrangements of the memory cells 400, 500, or portions thereof, may include other components that are not illustrated (e.g., additional layers such as a spacer layer, around the gate electrode of the transistor 410, etc.). For example, although not specifically illustrated in FIGS. 4 and 5, a dielectric spacer may be provided between the source electrode and the gate stack as well as between the transistor drain electrode and the gate stack of the transistor 410 of FIGS. 4 and 5 in order to provide electrical isolation between the source, gate, drain electrodes. In another example, although not specifically illustrated in FIGS. 4 and 5, at least portions of the memory cells 400, 500 may be surrounded in an insulator material, such as any suitable ILD material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the memory cells 400, 500 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass.

Turning to the details of FIG. 4, the memory cell 400 may include a transistor 410 (the approximate outline of which is illustrates in FIG. 4 with a dashed contour) and a resistive switching device 420, which may be examples of, respectively, the transistor 210 and the resistive switching device 220, described herein. As shown in FIG. 4, the transistor 410 may include a channel material 404. In particular, the channel material 404 may be a thin-film channel material, e.g., any of the thin-film channel materials described above. A gate stack 406 including a gate electrode material 408 and, optionally, a gate dielectric material 412, may be provided over a portion of the channel material 404 as shown in FIG.

4. First and a second S/D regions 414-1, 414-2 may be included on either side of the gate stack 406, thus realizing a transistor.

The gate electrode material 408 may include at least one P-type work function metal or N-type work function metal, depending on whether the access transistor 410 is a P-type MOS (PMOS) transistor or an N-type MOS (NMOS) transistor (P-type work function metal used as the gate electrode material 408 when the access transistor 410 is a PMOS transistor and N-type work function metal used as the gate electrode material 408 when the access transistor 410 is an NMOS transistor). For a PMOS transistor, metals that may be used for the gate electrode material 408 may include, but are not limited to, ruthenium, palladium, platinum, cobalt, nickel, and conductive metal oxides (e.g., ruthenium oxide). For an NMOS transistor, metals that may be used for the gate electrode material 408 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 408 may include a stack of two or more metal layers, where one or more metal layers are work function metal layers and at least one metal layer is a fill metal layer. Further layers may be included next to the gate electrode material 408 for other purposes, such as to act as a diffusion barrier layer or/and an adhesion layer.

In some embodiments, the gate dielectric material 412 may include one or more high-k dielectrics including any of the materials discussed herein with reference to the insulator material that may surround portions of the memory cell 400. In some embodiments, an annealing process may be carried out on the gate dielectric material 412 during manufacture of the access transistor 410 to improve the quality of the gate dielectric material 412. The gate dielectric material 412 may have a thickness that may, in some embodiments, be between about 0.5 nanometers and 4 nanometers, including all values and ranges therein (e.g., between about 1 and 4 nanometers, or between about 1 and 2 nanometers). In some embodiments, the gate stack 406 may be surrounded by a gate spacer, not shown in FIG. 4. Such a gate spacer would be configured to provide separation between the gate stack 406 and source/drain contacts of the transistor 410 and could be made of a low-k dielectric material, some examples of which have been provided above. A gate spacer may include pores or air gaps to further reduce its dielectric constant.

Turning to the S/D regions 414, as is well known in the art, source and drain regions are formed for the gate stack of each metal-oxide-semiconductor (MOS) transistor. As described above, the source and drain regions of a transistor are interchangeable, and a nomenclature of a first S/D region and a second S/D region of an access transistor has been introduced for use in the present disclosure. In FIG. 4, reference numeral 414-1 is used to label the first S/D region and reference numeral 414-2 is used to label the second S/D region of the access transistor 410. The S/D regions 414 of the transistor 410 may generally be formed using either an implantation/diffusion process or an etching/deposition process. In the former process, dopants such as boron, aluminum, antimony, phosphorous, or arsenic may be ion-implanted into the channel material 404 to form the source and drain regions. An annealing process that activates the dopants and causes them to diffuse further into the channel material 404 may follow the ion implantation process. In the latter process, portions of the channel material 404 may first be etched to form recesses at the locations of the future S/D regions 414. An epitaxial deposition process may then be carried out to fill the recesses with material that is used to fabricate the S/D regions 414. In some implementations, the S/D regions 414 may be fabricated using a silicon alloy such as silicon germanium or silicon carbide. In some implementations the epitaxially deposited silicon alloy may be doped in situ with dopants such as boron, arsenic, or phosphorous. In further embodiments, the S/D regions 414 may be formed using one or more alternate semiconductor materials such as germanium or a group III-V material or alloy. And in further embodiments, one or more layers of metal and/or metal alloys may be used to form the S/D regions 414.

FIG. 4 further illustrates contacts 416-1, 416-2 to respective ones of the first and second S/D regions 414-1, 414-2. In various embodiments, one or more layers of metal and/or metal alloys may be used to form the S/D contacts 416. For example, the electrically conductive materials of the S/D contacts 416 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contacts 416 may include one or more electrically conductive alloys, oxides, or carbides of one or more metals. In some embodiments, the S/D contacts 416 may include a doped semiconductor, such as silicon or another semiconductor doped with an N-type dopant or a P-type dopant. Metals may provide higher conductivity, while doped semiconductors may be easier to pattern during fabrication. Although FIG. 4 illustrates the first and second S/D contacts 416 with a single pattern, suggesting that the material composition of the first and second S/D contacts 416 is the same, this may not be the case in some other embodiments of the transistor 410 (the same applies to other elements shown with the same pattern in the present drawings). Thus, in some embodiments, the material composition of the first S/D contact 416-1 may be different from the material composition of the second S/D contact 416-2.

As shown in FIG. 4, the first S/region 414-1 may be coupled to the resistive switching device 420, in particular to a first electrode 422-1 of the resistive switching device 420, and the first electrode 422-1 may be separated from a second electrode 422-2 of the resistive switching device 420 by an insulator 424. The first and second electrodes 422 and the insulator 424 of the resistive switching device 420 may include any of the suitable materials as described herein.

Although not specifically shown in FIG. 4, the second electrode 422-2 of the resistive switching device 420 (and, thus, the first S/D region 414-1 of the transistor 410) may be coupled to the SL, e.g., to the SL 260 of FIG. 2, while the second S/D region 414-2 of the transistor 410 may be coupled to the BL, e.g., to the BL 240 of FIG. 2. An example BL and SL are shown in the memory cell 500 of FIG. 5 as a BL 540 and an SL 560. Otherwise, the memory cell 500 is substantially the same as the memory cell 400, shown in FIG. 4, so that the descriptions of the memory cell 400 are applicable to the memory cell 500 and, in the interests of brevity, are not repeated.

While FIGS. 4 and 5 illustrate the transistor 410 as a top-gated transistor with both S/D contacts 416 on one side of the channel material 404 and on the same side as the gate stack 406, in other embodiments, the transistor 410 may be of different architectures.

Figure 6:
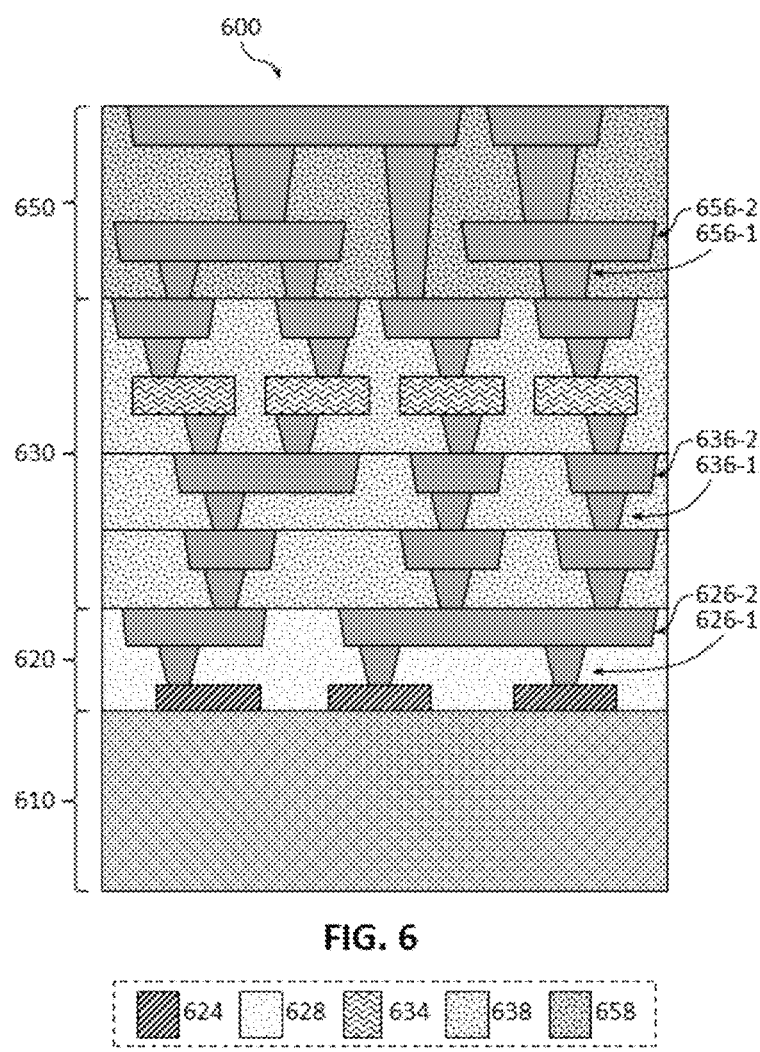
FIG. 6 provides a schematic illustration of a cross-sectional side view of an example IC device with backend memory with resistive switching devices, according to some embodiments of the present disclosure.

FIG. 6 provides a schematic illustration of a cross-sectional side view of an example IC device 600 with backend memory with resistive switching devices, according to some embodiments of the present disclosure. The IC device 600 is an example of the IC device 100, described above.

As shown in FIG. 6, the IC device 600 may include a support structure 610, which may be an example of the support structure 110 of the IC device 100. An FEOL layer 620, which may be an example of the FEOL layer 120 of the IC device 100, may be provided over the support structure 622, where the FEOL layer 620 may include FEOL devices 624 such as frontend transistors (e.g., finFETs, nanoribbon transistors, nanowire transistors, or planar transistors) and a plurality of interconnects 626. The interconnects 626 may include any suitable combination of vias 626-1 and lines 626-2, some of which are labeled in FIG. 6 and some of which are not labeled in order to not clutter the drawing. The interconnects 626 may include any suitable conductive materials, such as any of the conductive metals or metal alloys as described above. Portions of various ones of the interconnects 626 may be enclosed by an insulator material 628, which may include any of the insulator materials described above.

FIG. 6 further illustrates a first memory layer 630 provided above the FEOL layer 620. The first memory layer 630 may be an example of the first memory layer 130 of the BEOL layer 190, described above. As shown in FIG. 6, the first memory layer 630 may include memory cells 634, as well as a plurality of BEOL interconnects 636. FIG. 6 schematically illustrates a single layer of the memory cells 634 (e.g., the first memory layer 130 as described above), although, in other embodiments, the IC device 600 may include any suitable number of layers of the memory cells 634, as described above with reference to FIG. 1. The memory cells 634 may be any of the memory cells described above, e.g., MRAM cells or RRAM cells, implementing stacked backend memory with resistive switching devices, as described above. The BEOL interconnects 636 may include any suitable combination of vias 636-1 and lines 636-2, some of which are labeled in FIG. 6 and some of which are not labeled in order to not clutter the drawing. The BEOL interconnects 636 may include any suitable conductive materials, such as any of the conductive metals or metal alloys as described above. Portions of various ones of the BEOL interconnects 636 may be enclosed by an insulator material 638, which may include any of the insulator materials described above. One or more of the BEOL interconnects 636 may be electrically coupled to (e.g., in electrically conductive contact with at least portions of) one or more of the plurality of FEOL devices 624.

FIG. 6 further illustrates a power and signal interconnect layer 650, provided over the first memory layer 630. The power and signal interconnect layer 650 may be an example of the power and signal interconnect layer 150, described above. As shown in FIG. 6, the power and signal interconnect layer 650 may include a plurality of power and signal interconnects 656, which may include any suitable combination of vias 656-1 and lines 656-2, some of which are labeled in FIG. 6 and some of which are not labeled in order to not clutter the drawing. The power and signal interconnects 656 may include any suitable conductive materials, such as any of the conductive metals or metal alloys as described above. Portions of various ones of the power and signal interconnects 656 may be enclosed by an insulator material 658, which may include any of the insulator materials described above. One or more of the power and signal interconnects 656 may be electrically coupled to (e.g., in electrically conductive contact with at least portions of) one or more of the BEOL interconnects 636, the memory cells 634, and the FEOL devices 624.

IC devices with stacked backend memory with resistive switching devices as disclosed herein may be included in any suitable electronic device. FIGS. 7-11 illustrate various examples of devices and components that may include one or more IC devices with stacked backend memory with resistive switching devices as disclosed herein.

Figures 7A, 7B:
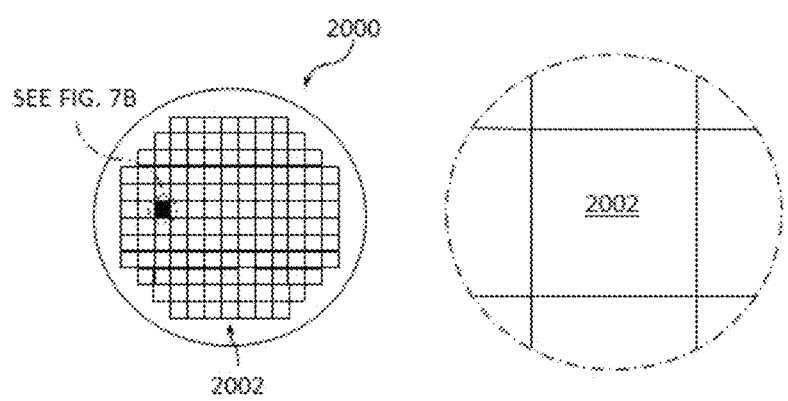
FIGS. 7A-7B are top views of a wafer and dies that include stacked backend memory with resistive switching devices in accordance with any of the embodiments disclosed herein.

FIGS. 7A-7B are top views of a wafer 2000 and dies 2002 that may include one or more IC devices with stacked backend memory with resistive switching devices in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 9. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including stacked backend memory with resistive switching devices as described herein). After the fabrication of the semiconductor product is complete (e.g., after manufacture of stacked backend memory with resistive switching devices as described herein, e.g., any embodiment of the IC devices with stacked backend memory with resistive switching devices, described herein), the wafer 2000 may undergo a singulation process in which each of the dies 2002 is separated from one another to provide discrete "chips" of the semiconductor product. In particular, devices that include stacked backend memory with resistive switching devices as disclosed herein may take the form of the wafer 2000 (e.g., not singulated) or the form of the die 2002 (e.g., singulated). The die 2002 may include one or more transistors (e.g., one or more transistors of the FEOL layer 120 and one or more transistors of the BEOL layer 190, as described herein and/or one or more FEOL transistors 2140 of FIG. 8, discussed below), one or more memory cells (e.g., one or more 1T-1RSD memory cells or any other memory cells with resistive switching devices as described herein), and/or supporting circuitry (e.g., one or more interconnects as described herein) to route electrical signals to the transistors and/or the memory cells, as well as any other IC components. In some embodiments, the wafer 2000 or the die 2002 may implement or include a memory device, a logic device (e.g., an AND, OR, NAND, or NOR gate), or any other suitable circuit element. Multiple ones of these devices may be combined on a single die 2002. For example, a memory array formed by multiple memory cells in a given layer may be formed on a same die 2002 as a processing device (e.g., the processing device 2402 of FIG. 11) or other logic that is configured to store information in the memory devices or execute instructions stored in the memory array.

Figure 8:
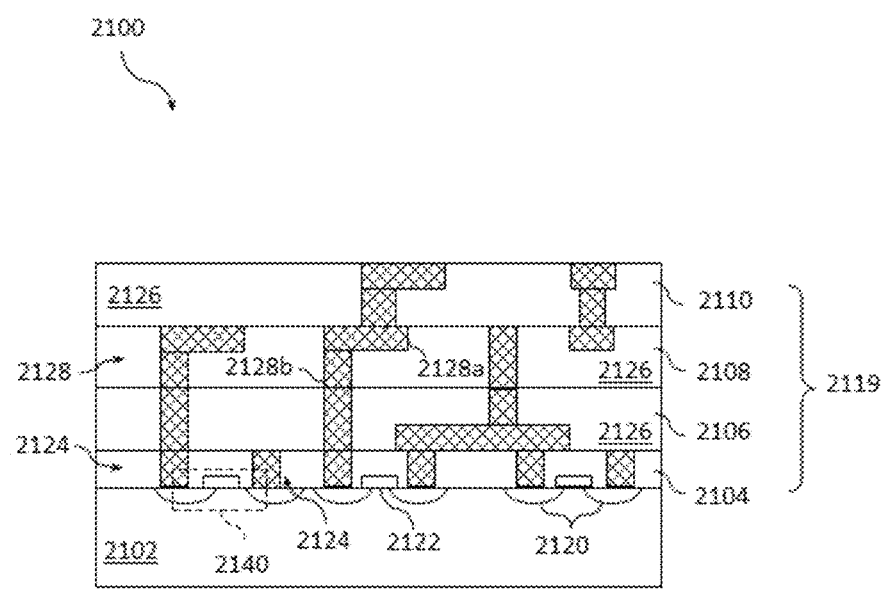
FIG. 8 is a cross-sectional side view of one side of an IC device that may include stacked backend memory with resistive switching devices in accordance with any of the embodiments disclosed herein.

FIG. 8 is a cross-sectional side view of one side of an IC device 2100 that may include stacked backend memory with resistive switching devices in accordance with any of the embodiments disclosed herein. For example, the IC device 2100 may be, or may include, the IC device 100, described above, i.e., may be an IC device with stacked backend memory with resistive switching devices, as described herein. In particular, the memory cells with resistive switching devices as described herein may be implemented in any of the BEOL layers of the IC device 2100, e.g., in any of the interconnect layers 2106-2110 shown in FIG. 8. Because there are various possibilities where such stacked backend memory with resistive switching devices may be integrated in the IC device 2100, the memory cells with resistive switching devices are not specifically shown in FIG. 8. For example, in some embodiments, stacked backend memory with resistive switching devices as described herein may be included above the interconnect layers 2106-2110 of the IC device 2100. In another example, at least some of the memory cells with resistive switching devices as described herein may be included within one or more of the interconnect layers 2106-2110 of the IC device 2100. In some embodiments, the IC device 2100 may serve as any of the dies 2256 in the IC package 2300.

As shown in FIG. 8, the IC device 2100 may be formed on a substrate 2102 (e.g., the wafer 2000 of FIG. 7A) and may be included in a die (e.g., the die 2002 of FIG. 7B). The substrate 2102 may include any material that may serve as a foundation for an IC device 2100. The substrate 2102 may be a semiconductor substrate and may include any of the examples described above with reference to the support structure 110. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 7B) or a wafer (e.g., the wafer 2000 of FIG. 7A).

The IC device 2100 may include one or more device layers 2104 disposed on the substrate 2102. The device layers 2104 provide one example of one or more layers with the logic devices of the FEOL layer 120, described above. The device layer 2104 may include features of one or more transistors 2140 (e.g., metal-oxide-semiconductor field-effect transistors (MOSFETs)) formed on the substrate 2102. The transistors 2140 provide one example of any of the transistors of the FEOL layer 120, described above. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric 412. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode 408.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes them to diffuse farther into the substrate 2102 may follow the ion implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Various transistors 2140 are not limited to the type and configuration depicted in FIG. 8 and may include a wide variety of other types and configurations such as, for example, planar transistors, non-planar transistors (e.g., FinFETs, nanowire, or nanoribbon transistors), or a combination of both.

Electrical signals, such as power and/or input/output (I/O) signals, may be routed to and/or from the transistors 2140 of the device layer 2104 through one or more interconnect layers disposed on the device layer 2104 (illustrated in FIG. 8 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 8). Although a particular number of interconnect layers 2106-1210 is depicted in FIG. 8, embodiments of the present disclosure include IC devices having more or fewer interconnect layers than depicted.

In some embodiments, the interconnect structures 2128 may include trench structures 2128*a* (sometimes referred to as "lines") and/or via structures 2127B (sometimes referred to as "holes") filled with an electrically conductive material such as a metal. The trench structures 2128*a* may be arranged to route electrical signals in a direction of a plane that is substantially parallel with a surface of the substrate 2102 upon which the device layer 2104 is formed. For example, the trench structures 2128*a* may route electrical signals in a direction in and out of the page from the perspective of FIG. 8. The via structures 2127B may be arranged to route electrical signals in a direction of a plane that is substantially perpendicular to the surface of the substrate 2102 upon which the device layer 2104 is formed. In some embodiments, the via structures 2127B may electrically couple trench structures 2128*a* of different interconnect layers 2106-2110 together.

The interconnect layers 2106-2110 may include a dielectric material 2126 disposed between the interconnect structures 2128, as shown in FIG. 8. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the insulator/dielectric materials described above.

A first interconnect layer 2106 (referred to as Metal 1 or "M1") may be formed directly on the device layer 2104. In some embodiments, the first interconnect layer 2106 may include trench structures 2128*a* and/or via structures 2127B, as shown. The trench structures 2128*a* of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2127B to couple the trench structures 2128*a* of the second interconnect layer 2108 with the trench structures 2128*a* of the first interconnect layer 2106. Although the trench structures 2128*a* and the via structures 2127B are structurally delineated with a line within each interconnect layer (e.g., within the second interconnect layer 2108) for the sake of clarity, the trench structures 2128*a* and the via structures 2127B may be structurally and/or materially contiguous (e.g., simultaneously filled during a dual damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The interconnect layers 2106-2110 may be the metal layers M1-M3, described above. Further metal layers may be present in the IC device 2100, as also described above.

Figure 9:
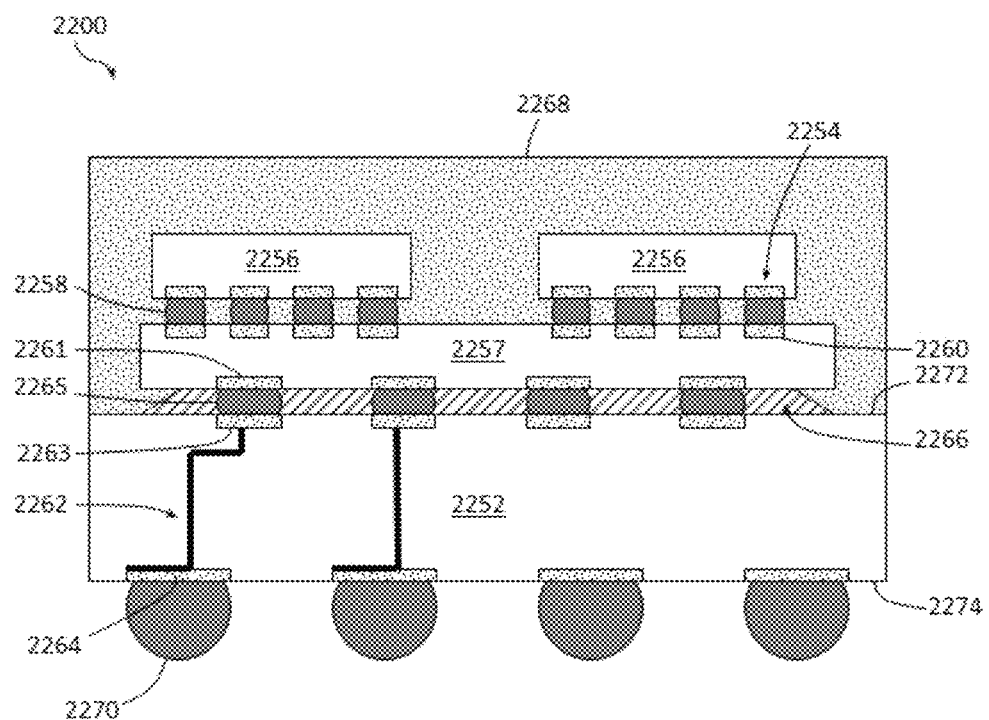
FIG. 9 is a cross-sectional side view of an IC package that may include one or more IC devices with stacked backend memory with resistive switching devices in accordance with any of the embodiments disclosed herein.

FIG. 9 is a side, cross-sectional view of an example IC package 2200 that may include IC devices with stacked backend memory with resistive switching devices in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 8.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 9 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 9 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 9 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 10.

The dies 2256 may take the form of any of the embodiments of the die 2002 discussed herein (e.g., may include any of the embodiments of the IC device 2100). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include stacked backend memory with resistive switching devices, e.g., as discussed above; in some embodiments, at least some of the dies 2256 may not include stacked backend memory with resistive switching devices.

The IC package 2200 illustrated in FIG. 9 may be a flip-chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 9, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 10:
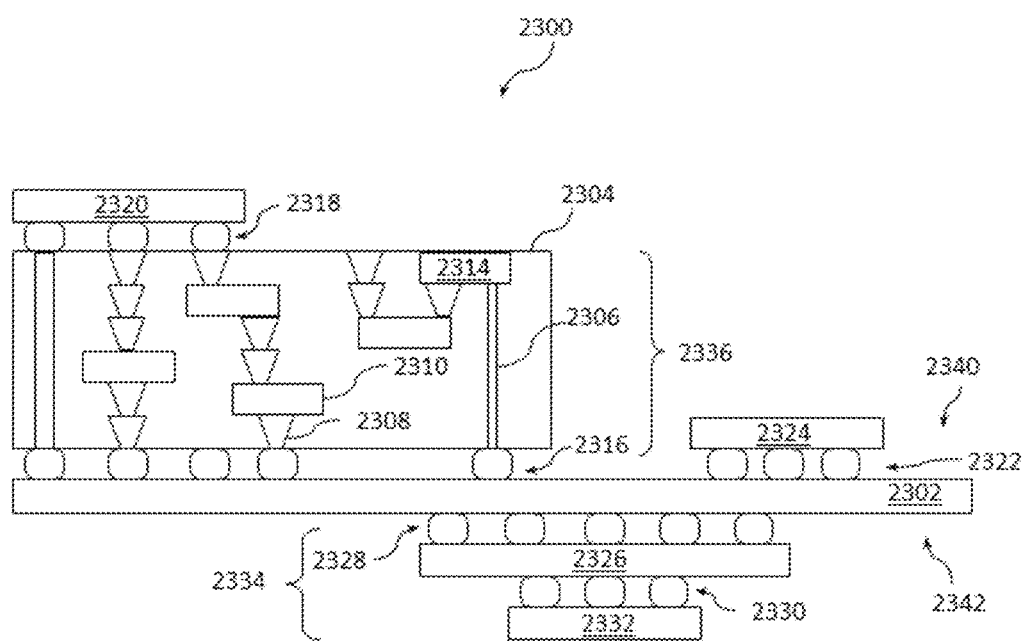
FIG. 10 is a cross-sectional side view of an IC device assembly that may include one or more IC devices with stacked backend memory with resistive switching devices in accordance with any of the embodiments disclosed herein.

FIG. 10 is a cross-sectional side view of an IC device assembly 2300 that may include components having one or more IC devices with stacked backend memory with resistive switching devices in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices with stacked backend memory with resistive switching devices in accordance with any of the embodiments disclosed herein; e.g., any of the IC packages discussed below with reference to the IC device assembly 2300 may take the form of any of the embodiments of the IC package 2200 discussed above with reference to FIG. 9 (e.g., may include one or more IC devices with stacked backend memory with resistive switching devices provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 10 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 10), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 7B), an IC device (e.g., the IC device 2100 of FIG. 8), or any other suitable component. In particular, the IC package 2320 may include one or more IC devices with stacked backend memory with resistive switching devices as described herein. Although a single IC package 2320 is shown in FIG. 10, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 10, the IC package 2320 and the circuit board 2302 are attached to opposing sides of the interposer 2304; in other embodiments, the IC package 2320 and the circuit board 2302 may be attached to the same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 10 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 11:
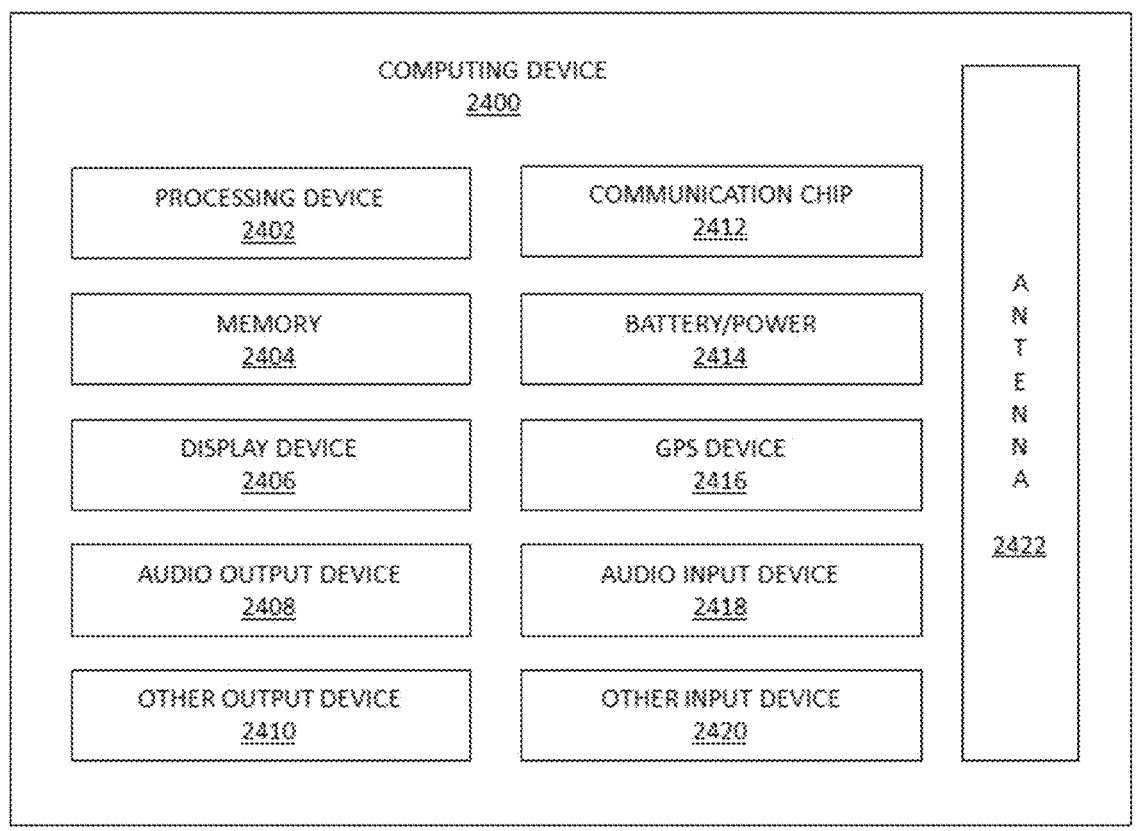
FIG. 11 is a block diagram of an example computing device that may include one or more IC devices with stacked backend memory with resistive switching devices in accordance with any of the embodiments disclosed herein.

FIG. 11 is a block diagram of an example computing device 2400 that may include one or more components with one or more IC devices with stacked backend memory with resistive switching devices in accordance with any of the embodiments disclosed herein. For example, any suitable ones of the components of the computing device 2400 may include a die (e.g., the die 2002 (FIG. 7B)) including stacked backend memory with resistive switching devices in accordance with any of the embodiments disclosed herein. Any of the components of the computing device 2400 may include an IC device 2100 (FIG. 8) and/or an IC package 2200 (FIG. 9). Any of the components of the computing device 2400 may include an IC device assembly 2300 (FIG. 10).

A number of components are illustrated in FIG. 11 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 11, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory. The memory 2404 may include one or more IC devices with stacked backend memory with resistive switching devices as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 602.11 family), IEEE 602.16 standards (e.g., IEEE 602.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 602.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 602.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example 1 provides an IC device that includes a support structure; a FEOL layer, including a plurality of FEOL devices; and a BEOL layer, including a plurality of resistive switching devices, where the FEOL layer is between the support structure and the BEOL layer (e.g., if the support structure is a substrate on which the FEOL devices were fabricated), or the BEOL layer is between the FEOL layer and the support structure (e.g., if the BEOL layer, possibly with some additional layers in between is attached to the support structure in a flip-chip configuration after the FEOL and the BEOL layers have been formed).

Example 2 provides the IC device according to example 1, where the plurality of resistive switching devices are included in memory cells of a memory array.

Example 3 provides the IC device according to example 2, where an individual memory cell of the memory cells of the memory array includes a transistor and a resistive switching device of the plurality of resistive switching devices.

Example 4 provides the IC device according to example 3, where the transistor of the individual memory cell includes a first source or drain (S/D) region and a second S/D region, and the resistive switching device of the individual memory cell is coupled to the first S/D region.

Example 5 provides the IC device according to example 4, where the resistive switching device of the individual memory cell has a first terminal and a second terminal, the first terminal is coupled to the first S/D region, and the second terminal is coupled to an interconnect.

Example 6 provides the IC device according to example 5, where the interconnect is a first interconnect and the second S/D region of the transistor of the individual memory cell is coupled to a second interconnect.

Example 7 provides the IC device according to example 6, where the first interconnect and the second interconnect are electrically conductive lines in different planes of the BEOL layer.

Example 8 provides the IC device according to examples 6 or 7, where the first interconnect is a SL for the individual memory cell and the second interconnect is a BL for the individual memory cell.

Example 9 provides the IC device according to any one of examples 4-8, where the transistor of the individual memory cell further includes a channel material between the first S/D region and the second S/D region, and where an electrical connection to the first S/D region (e.g., the electrical connection that is in conductive contact with the first S/D region) and an electrical connection to the second S/D region (e.g., the electrical connection that is in conductive contact with the second S/D region) are on a single side with respect to the channel material. Thus, a contact to the first S/D region and a contact to the second S/D region may both be frontside contacts, or may both be backside contacts.

Example 10 provides the IC device according to example 9, where a gate of the transistor is on the single side with the electrical connection to the first S/D region and the electrical connection to the second S/D region.

Example 11 provides the IC device according to example 9, where a gate of the transistor is on a side that is opposite the single side.

Example 12 provides the IC device according to any one of examples 4-8, where the transistor of the individual memory cell further includes a channel material between the first S/D region and the second S/D region, and where an electrical connection to the first S/D region (e.g., the electrical connection that is in conductive contact with the first S/D region) and an electrical connection to the second S/D region (e.g., the electrical connection that is in conductive contact with the second S/D region) are on different sides with respect to the channel material. Thus, a contact to the first S/D region may be a frontside contact while a contact to the second S/D region may be a backside contact, or vice versa.

Example 13 provides the IC device according to example 12, where a gate of the transistor is on a side of the electrical connection to the first S/D region.

Example 14 provides the IC device according to any one of examples 3-13, where the transistor is a TFT.

Example 15 provides the IC device according to any one of examples 2-14, where the memory array is a back end memory array.

Example 16 provides the IC device according to any one of the preceding examples, where two or more of the plurality of the resistive switching devices are MTJs.

Example 17 provides the IC device according to any one of the preceding examples, where two or more of the plurality of the resistive switching devices are FODs.

Example 18 provides the IC device according to any one of the preceding examples, where an individual resistive switching device of the plurality of the resistive switching devices includes a first electrode, a second electrode, and an insulator between the first electrode and the second electrode.

Example 19 provides the IC device according to example 18, where at least one of the first electrode and the second electrode includes a magnetic material.

Example 20 provides the IC device according to example 19, where the insulator includes at least one of an oxide of a semiconductor material, an oxide of a transition metal, a sulfide, or an electrolyte.

Example 21 provides the IC device according to example 18, where at least one of the first electrode and the second electrode includes an electrically conductive, substantially non-magnetic material.

Example 22 provides the IC device according to example 21, where the insulator includes at least one of an oxide of a transition metal, a sulfide, or an electrolyte.

Example 23 provides the IC device according to any one of the preceding examples, where the support structure includes glass (e.g., at least a portion of a glass wafer).

Example 24 provides the IC device according to any one of the preceding examples, where the support structure includes mica.

Example 25 provides the IC device according to any one of the preceding examples, where the support structure includes a material having a dielectric constant lower than 10.

Example 26 provides an IC device that includes a support structure; and a memory array over the support structure, the memory array including a memory cell including a TFT having a first source or drain (S/D) region and a second S/D region, and a resistive switching device coupled to the first S/D region.

Example 27 provides the IC device according to example 26, where the resistive switching device has a first terminal and a second terminal, the first terminal is coupled to the first S/D region, and the second terminal is coupled to an interconnect.

Example 28 provides the IC device according to example 27, where the interconnect is a first interconnect and the second S/D region is coupled to a second interconnect.

Example 29 provides the IC device according to example 28, where the first interconnect and the second interconnect are electrically conductive lines in different layers over the support structure.

Example 30 provides the IC device according to examples 28 or 29, where the first interconnect is a SL for the memory cell and the second interconnect is a BL for the memory cell.

Example 31 provides the IC device according to any one of examples 26-30, where the transistor further includes a channel material between the first S/D region and the second S/D region, and where an electrical connection to the first S/D region (e.g., the electrical connection that is in conductive contact with the first S/D region) and an electrical connection to the second S/D region (e.g., the electrical connection that is in conductive contact with the second S/D region) are on a single side with respect to the channel material. Thus, a contact to the first S/D region and a contact to the second S/D region may both be frontside contacts, or may both be backside contacts.

Example 32 provides the IC device according to example 31, where a gate of the transistor is on the single side with the electrical connection to the first S/D region and the electrical connection to the second S/D region.

Example 33 provides the IC device according to example 31, where a gate of the transistor is on a side that is opposite the single side.

Example 34 provides the IC device according to any one of examples 26-30, where the transistor further includes a channel material between the first S/D region and the second S/D region, and where an electrical connection to the first S/D region (e.g., the electrical connection that is in conductive contact with the first S/D region) and an electrical connection to the second S/D region (e.g., the electrical connection that is in conductive contact with the second S/D region) are on different sides with respect to the channel material. Thus, a contact to the first S/D region may be a frontside contact while a contact to the second S/D region may be a backside contact, or vice versa.

Example 35 provides the IC device according to example 34, where a gate of the transistor is on a side of the electrical connection to the first S/D region.

Example 36 provides the IC device according to any one of examples 26-35, where the resistive switching device is an MTJ.

Example 37 provides the IC device according to any one of examples 26-35, where the resistive switching device is an FOD.

In various further examples of the IC device according to any one of examples 26-37, the resistive switching device may be a resistive switching device according to any one of examples 18-22, and/or the support structure may be a support structure according to any one of examples 23-25, and/or the IC device according to any one of examples 26-37 may further includes features according to any one of examples 1-25.

Example 38 provides an IC package that includes an IC device according to any one of the preceding examples; and a further IC component, coupled to the IC device. For example, the IC device may include a frontend layer including a plurality of transistors that includes one or more of fin-based transistors, nanoribbon transistors, and nanowire transistors; a backend layer including a plurality of TFTs coupled to various resistive switching devices; and a support structure.

Example 39 provides the IC package according to example 38, where the further IC component includes one of a package substrate, an interposer, or a further IC die.

Example 40 provides the IC package according to examples 38 or 40, where the IC device includes, or is a part of, at least one of a memory device, a computing device, a wearable device, a handheld electronic device, and a wireless communications device.

Example 41 provides an electronic device that includes a carrier substrate; and one or more of the IC device according to any one of the preceding examples and the IC package according to any one of the preceding examples, coupled to the carrier substrate.

Example 42 provides the electronic device according to example 41, where the carrier substrate is a motherboard.

Example 43 provides the electronic device according to example 41, where the carrier substrate is a PCB.

Example 44 provides the electronic device according to any one of examples 41-43, where the electronic device is a wearable electronic device (e.g., a smart watch) or handheld electronic device (e.g., a mobile phone).

Example 45 provides the electronic device according to any one of examples 41-44, where the electronic device further includes one or more communication chips and an antenna.

Example 46 provides the electronic device according to any one of examples 41-45, where the electronic device is an RF transceiver.

Example 47 provides the electronic device according to any one of examples 41-45, where the electronic device is one of a switch, a power amplifier, a low-noise amplifier, a filter, a filter bank, a duplexer, an upconverter, or a downconverter of an RF communications device, e.g., of an RF transceiver.

Example 48 provides the electronic device according to any one of examples 41-45, where the electronic device is a computing device.

Example 49 provides the electronic device according to any one of examples 41-48, where the electronic device is included in a base station of a wireless communication system.

Example 50 provides the electronic device according to any one of examples 41-48, where the electronic device is included in a user equipment device (i.e., a mobile device) of a wireless communication system.

Example 51 provides a method of fabricating an IC device. The method includes providing a frontend layer over a semiconductor support structure, the frontend layer including a plurality of frontend devices; and providing a backend layer over the frontend layer, the backend layer including a memory array with memory cells including resistive switching devices, one or more of the memory cells coupled to one or more of the plurality of frontend devices (e.g., one or more of the resistive switching devices coupled to one or more of the plurality of frontend devices).

Example 52 provides the method according to example 51, where two or more of the plurality of the resistive switching devices are MTJs.

Example 53 provides the method according to examples 51 or 52, where two or more of the plurality of the resistive switching devices are FODs.

Example 54 provides the method according to any one of examples 51-53, further including processes for forming the IC device according to any one of the preceding examples (e.g., for forming the IC device according to any one of examples 1-37), and/or processes for forming the IC package according to any one of the preceding examples (e.g., for forming the IC package according to any one of examples 38-40), and/or processes for forming the electronic device according to any one of the preceding examples (e.g., for forming the electronic device according to any one of examples 41-50).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a first layer comprising transistors; and
a second layer comprising a memory cell,
wherein:
the memory cell includes a transistor and a resistive switching device,
the transistor has a first region and a second region,
one of the first region and the second region is a source region of the transistor and another one of the first region and the second region is a drain region of the transistor,
the resistive switching device has a first terminal and a second terminal,
the first terminal is coupled to the first region,
the second terminal is coupled to a select-line for the memory cell, and
the second region is coupled to a bit-line for the memory cell.

2. The IC device according to claim 1, wherein the transistor further includes a channel material between the first region and the second region, one of an electrical connection to the first region and an electrical connection to the second region is on a front side of the channel material, and another one of the electrical connection to the first region and the electrical connection to the second region is on a back side of the channel material.

3. The IC device according to claim 1, wherein the resistive switching devices is a magnetic tunnel junction.

4. The IC device according to claim 1, wherein the switching device further includes an insulator between the first terminal and the second terminal.

5. The IC device according to claim 4, wherein the insulator includes a transition metal.

6. The IC device according to claim 4, wherein the insulator includes a sulfide.

7. The IC device according to claim 4, wherein the insulator includes an electrolyte.

8. The IC device according to claim 1, further comprising a base, wherein the base includes glass, and wherein:
either the first layer is between the base and the second layer,
or the second layer is between the first layer and the base.

9. The IC device according to claim 1, further comprising a base, wherein the base includes mica, and wherein:
either the first layer is between the base and the second layer,
or the second layer is between the first layer and the base.

10. The IC device according to claim 1, further comprising a base, wherein the base includes a material having a dielectric constant lower than 10, and wherein:
either the first layer is between the base and the second layer,
or the second layer is between the first layer and the base.

11. The IC device according to claim 1, wherein the transistor is a thin-film transistor.

12. The IC device according to claim 11, wherein the select-line and the bit-line are electrically conductive lines in different layers over the second layer.

13. The IC device according to claim 1, wherein the select-line and the bit-line are electrically conductive lines in different layers over the second layer.

14. The IC device according to claim 1, wherein the resistive switching device is a filamentary oxide device.

15. An integrated circuit (IC) device, comprising:
a support structure; and
a memory array over the support structure, the memory array including a memory cell comprising:
a thin-film transistor (TFT) having a first region and a second region, wherein one of the first region and the second region is a source region and another one of the first region and the second region is a drain region, and
a resistive switching device having a first terminal and a second terminal,
wherein:
the first terminal is coupled to the first region,
the second terminal is coupled to a select-line for the memory cell,
the second region is coupled to a bit-line for the memory cell, and
the select-line and the bit-line are electrically conductive lines in different layers over the support structure.

16. The IC device according to claim 15, wherein the resistive switching device is a magnetic tunnel junction.

17. The IC device according to claim 15, wherein the resistive switching device is a filamentary oxide device.

18. A method of fabricating an integrated circuit (IC) device, the method comprising:
providing a memory array over a substrate, the memory array including a memory cell comprising:
a thin-film transistor (TFT) having a first region and a second region, wherein one of the first region and the second region is a source region and another one of the first region and the second region is a drain region, and
a resistive switching device having a first terminal and a second terminal,
wherein:
the first terminal is coupled to the first region,
the second terminal is coupled to a select-line for the memory cell,
the second region is coupled to a bit-line for the memory cell, and
the select-line and the bit-line are electrically conductive lines in different layers over the substrate.

19. The method according to claim 18, wherein the resistive switching device is a magnetic tunnel junctions.

20. The method according to claim 18, wherein the resistive switching device is a filamentary oxide devices.

* * * * *

UNITED STATES PATENT AND TRADEMARK OFFICE
CERTIFICATE OF CORRECTION

| | | |
|---|---|---|
| PATENT NO. | : 12,310,032 B2 | Page 1 of 1 |
| APPLICATION NO. | : 17/342144 | |
| DATED | : May 20, 2025 | |
| INVENTOR(S) | : Wilfred Gomes et al. | |

It is certified that error appears in the above-identified patent and that said Letters Patent is hereby corrected as shown below:

In the Claims

In Column 32, Claim 3, Line 30, delete "devices" and insert -- device --, therefor.

In Column 32, Claim 4, Line 32, delete "switching" and insert -- resistive switching --, therefor.

In Column 34, Claim 19, Line 21, delete "junctions." and insert -- junction. --, therefor.

In Column 34, Claim 20, Line 23, delete "devices." and insert -- device. --, therefor.

Signed and Sealed this
Fifteenth Day of July, 2025

Coke Morgan Stewart
*Acting Director of the United States Patent and Trademark Office*